United States Patent
Hamada et al.

(10) Patent No.: US 12,531,552 B2
(45) Date of Patent: Jan. 20, 2026

(54) DELAY CIRCUIT AND OPERATIONAL METHOD THEREOF

(71) Applicant: TAIWAN SEMICONDUCTOR MANUFACTURING COMPANY, LTD., Hsinchu (TW)

(72) Inventors: Masaya Hamada, Yokohama (JP); Makoto Yabuuchi, Tokyo (JP)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 18 days.

(21) Appl. No.: 18/770,907

(22) Filed: Jul. 12, 2024

(65) Prior Publication Data

US 2026/0019070 A1    Jan. 15, 2026

(51) Int. Cl.
*H03K 5/134* (2014.01)
*H03K 5/00* (2006.01)
*H03K 19/20* (2006.01)

(52) U.S. Cl.
CPC ... *H03K 5/134* (2014.07); *H03K 2005/00195* (2013.01); *H03K 19/20* (2013.01)

(58) Field of Classification Search
CPC ............... H03K 5/134; H03K 19/20; H03K 2005/00195
USPC .......................................................... 327/276
See application file for complete search history.

(56) References Cited

U.S. PATENT DOCUMENTS

| | | | |
|---|---|---|---|
| 2023/0011598 A1* | 1/2023 | Jang | H03F 3/245 |
| 2023/0038876 A1* | 2/2023 | Jang | H03K 19/0016 |
| 2024/0195410 A1* | 6/2024 | Kim | H03K 17/6871 |
| 2025/0119143 A1* | 4/2025 | Liu | G06F 30/392 |

* cited by examiner

*Primary Examiner* — Ryan Jager
(74) *Attorney, Agent, or Firm* — Birch, Stewart, Kolasch & Birch, LLP

(57) ABSTRACT

A circuit is provided. The circuit comprises a first power switch, a second power switch and delay elements. The first power switch adjusts a first voltage on a first metal line according to an input signal. The second power switch adjusts a second voltage on a second metal line according to the first voltage. The delay elements are coupled between the first metal line and the second metal line, and delay, in response to the adjusted first voltage and the adjusted second voltage, the input signal to generate an output signal.

20 Claims, 14 Drawing Sheets

DELAY CIRCUIT AND OPERATIONAL METHOD THEREOF

BACKGROUND

A delay circuit is usually implemented with a lot of logic gates or long metal lines to make a delay time. To generate a long delay time, the delay circuit needs to use many transistors for the logic gates or a lot of metal to form a long enough metal line. In such manner, a lot of resource and area is used. With the increasing integration and shrinking scale of electronic devices, it is important to provide a delay circuit with better resource and area efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
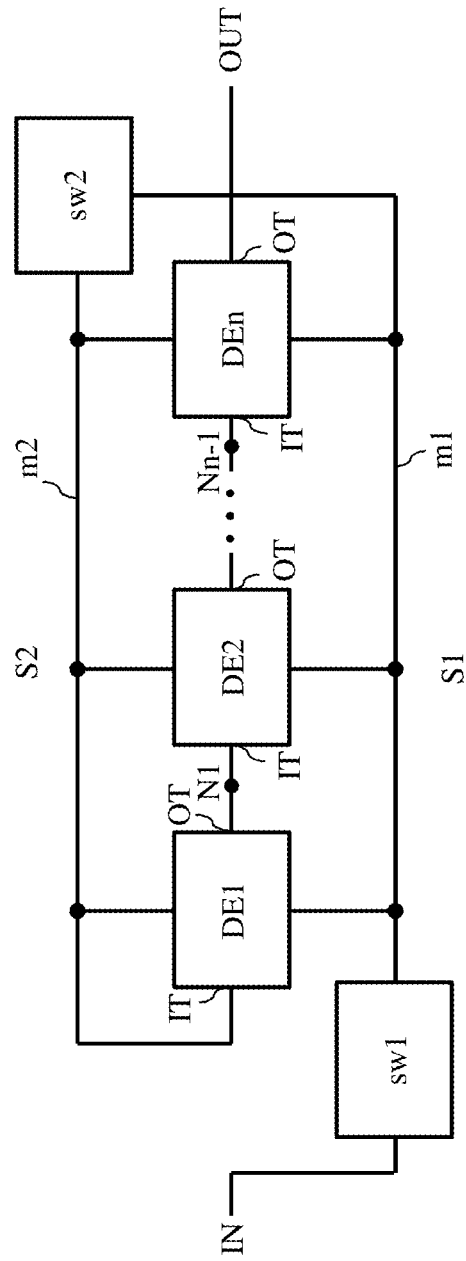
FIG. 1 is a schematic diagram of a delay circuit, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/ or" includes any of the associated listed items and all combinations of one or more of the associated listed items.

Reference is now made to FIG. 1. FIG. 1 is a schematic diagram of a delay circuit 10, in accordance with some embodiments of the present disclosure. In some embodiments, the delay circuit 10 is configured to generate delay time for signal propagation. For example, the delay circuit 10 receives an input signal IN and generates an output signal OUT, in which the output signal OUT is a delayed signal of the input signal IN.

For illustration, the delay circuit includes a power switch sw1, a power switch sw2, a metal line m1, a metal line m2 and a number "n" of delay elements DE (i.e., delay elements DE1 to DEn), in which "n" is an integer. Each of the delay elements DE is configured to propagate and delay a received signal. For example, a delay element DE receives a signal through an input terminal IT of the delay element DE. Then the delay element DE generates a delayed signal of the received signal at the output terminal OT of the delay element DE1. In some embodiments, the delay elements are logic gates.

In some embodiments, the delay elements DE1 to DEn are powered by a power source S1 through the metal line m1 and a power source S2 through the metal line m2.

In some embodiments, the power source S1 is configured as a VSS source (for ground voltage) and the power source S2 is configured as a VDD source (for working voltage) for the delay element DE. In some embodiment, the delay elements DE operate when the power source S1 having a low voltage level and the power source S2 having a high voltage level. For example, the delay element DE propagates received signal when the power source S1 having a low voltage level and the power source S2 having a high voltage level and stop propagating the received signal when the power source S1 having the high voltage level and the power source S2 having the low voltage level.

The power switch sw1 provides the power source S1 according to the input signal IN. The power switch sw2 provides the power source S2 according to the power source S1. In some embodiments, the power switches sw1 and sw2 are inverters. The power switch sw1 pulls down/up the power source S1 in response to the input signal IN pulled up/down. The power switch sw2 pulls down/up the power source S2 in response to the power source S1 pulled up/down.

As shown in FIG. 1, in some embodiments, the power switch sw1 is coupled to an input terminal of the delay circuit 10 to receive the input signal IN. The power switch sw1 is further coupled to the metal line m1. The power switch sw2 is coupled between the metal line m1 and the metal line m2. Each delay element DE is coupled between the metal line m1 and the metal line m2.

The delay elements DE are coupled in series between the metal line m2 and an output terminal of the delay circuit 10. For example, the delay element DE1 is coupled to the metal line m2 through its input terminal IT. The output terminal OT of the delay element DE1 is coupled to the input terminal IT of the delay element DE2. The output terminal OT of the delay element DE2 is coupled to the input terminal IT of the delay element DE3. The delay elements DE3 to DEn-1 are coupled in a similar fashion. The output terminal OT of the delay element DEn is coupled to the output terminal of the delay circuit 10 to provide the output signal OUT.

Figure 2:
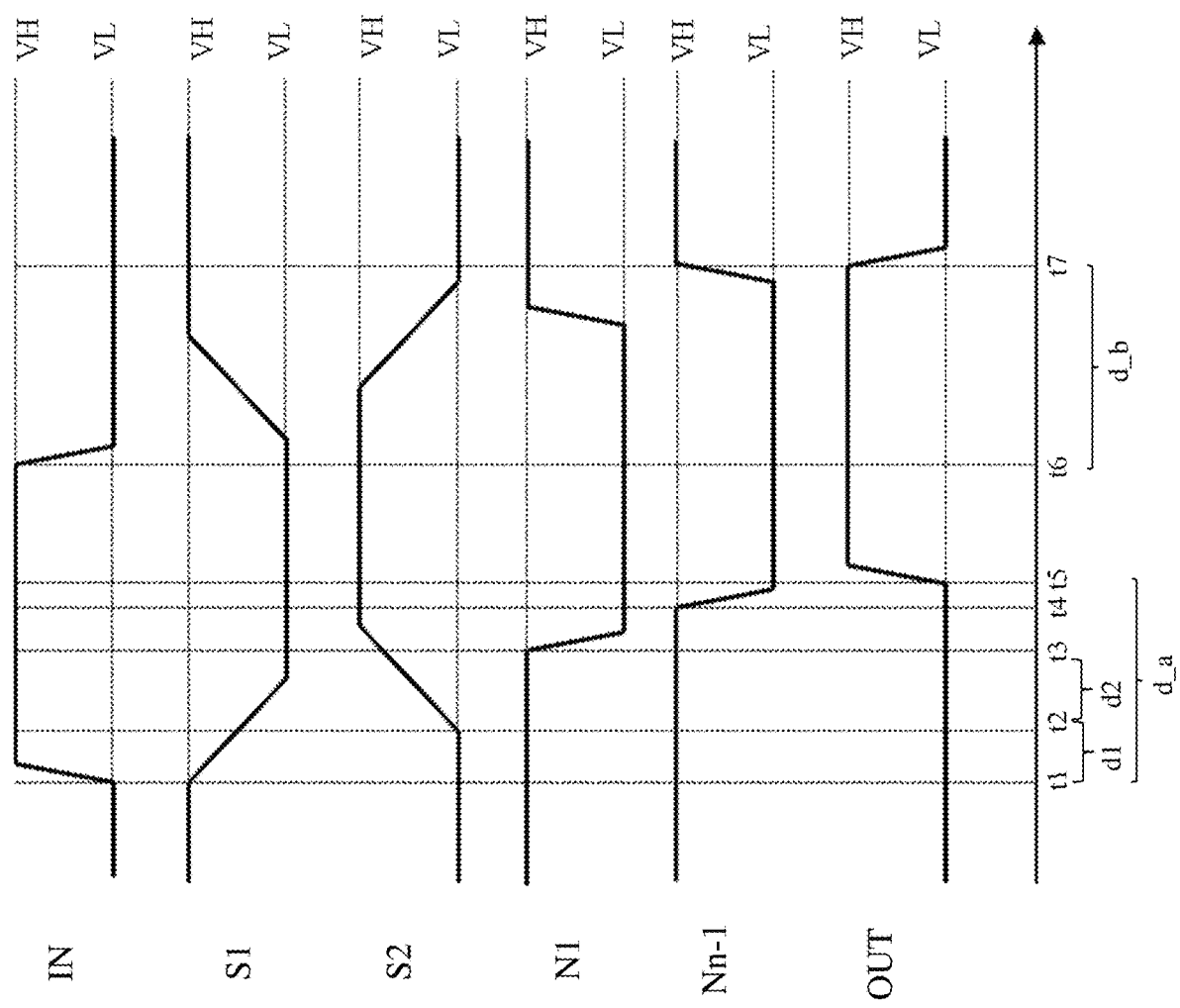
FIG. 2 is a timing diagram of voltage levels of signals corresponding to the delay circuit of FIG. 1, in accordance with some embodiments of the present disclosure.

Reference is now made to FIG. 1 and FIG. 2. FIG. 2 is a timing diagram of voltage levels of the input signal IN, the output signal OUT, a node N1, a node Nn−1, the power source S1 and the power source S2 corresponding to the delay circuit 10 of FIG. 1, in accordance with some embodiments of the present disclosure.

For illustration, at a time t1, a voltage level of the input signal is pulled up from a voltage level VL (e.g., a ground voltage 0V) to a voltage level VH (e.g., an operation voltage 1V) higher than the voltage VL. The power switch sw1 pulls down the voltage level of the power source S1 from the voltage level VH to the voltage level VL in response to the voltage level of the input signal pulled up.

In some embodiments, larger load (e.g., more delay elements DE and/or longer metal line m1 with parasitic capacitance and resistance) reduces the drivability of the power switch sw1 and increases the transition time of the power source S1. Specifically, having greater resistance of the metal line m1 having more transistors coupled to the metal line m1 reduces drivability of the power switch sw1 and increases the transition time of the power source S1. With the transition time of the power source S1 increased, the time period for the power source S1 to be pulled from the voltage level VH to the voltage level VL is greater than the time period for the input signal to be pulled from the voltage level VL to the voltage level VH as shown in FIG. 2.

At a time t2, the power switch sw2 pulls up the voltage level of the power source S2 from the voltage level VL to the voltage level VH in response to the voltage level of the power source S1 being pulled down to a low enough voltage level. A delay time d1 between the time t1 and the time t2 is caused by the increase of the transition time of the voltage level of the power source S1 as described in the previous paragraph.

Similar to the power switch sw1, larger load (longer metal line m2 and more delay elements DE) reduces the drivability of the power switch sw2 and increases the transition time of the power source S2. Specifically, having greater resistance of the metal line m2 and having more transistors coupled to the metal line m2 reduces drivability of the power switch sw2 and increases the transition time of the power source S2. With the transition time of the power source S2 increased, the time period for the power source S2 to be pulled from the voltage level VL to the voltage level VH is greater than the time period for the input signal to be pulled from the voltage level VL to the voltage level VH as shown in FIG. 2. In some embodiments, the reducing of drivability of the power switches sw1 and sw2 increases a delay time generated by each delay element DE.

At a time t3, in response to the power source S2 pulled up to a high enough voltage level and the power source S1 pulled down to a low enough voltage level (i.e., the power source S2 being higher than the power source S1 over a smallest operating voltage of the delay element DE), the delay element DE1 pulls down a voltage level of the node N1 that is between the output terminal OT of the delay element DE1 and the input terminal IT of the delay element DE2. A delay time d2 between the time t1 and the time t2 is caused by the increase of the transition time of the voltage level of the power sources S1-S2 and a delay time generated by the delay element DE1.

Then, each of the delay elements (DE2 to DEn−1) propagates and delays the received signal. For example, the delay element DE2 pulls up a voltage level of a node N2 that is between the output terminal OT of the delay element DE2 and the input terminal IT of the delay element DE3 in response to the voltage level of the node N1 pulled down. Subsequently, the delay element DE3 to DEn−1 pull up/down corresponding nodes in the similar way.

At a time t5, in response to the delay element DEn−1 pulling up a voltage level of the node Nn−1 that is between the output terminal OT of the delay element DEn−1 and the input terminal IT of the delay element DEn, the delay element DEn pulls up a voltage level of the output signal OUT.

As shown in FIG. 2, there is a delay time d_a between the rising of the input signal IN and the output signal OUT. The delay circuit 10 generates the output signal OUT that the input signal IN delayed with the delay time d_a. In other words, the delay circuit 10 delays the input signal IN by the delay time d_a.

The delay time d_a includes the delay time d1, the delay time d2 and the delay times generated by the delay elements DE. Accordingly, the delay time d_a is related to the length of the metal lines m1 and m2 and the number of the delay elements DE. Specifically, the longer length of the metal lines m1 and m2 and the more delay elements DE increase the delay time d_a.

Similar to delaying the rising of the input signal IN as described above, the delay circuit 10 delays the falling of the input signal IN with a delay time d_b in a similar way. For example, the falling of the output signal OUT signal at a time t7 is caused by the falling of the input signal IN at a time t6 and there is a delay time d_b between the falling of the output signal OUT signal and the falling of the input signal IN.

Figure 3:
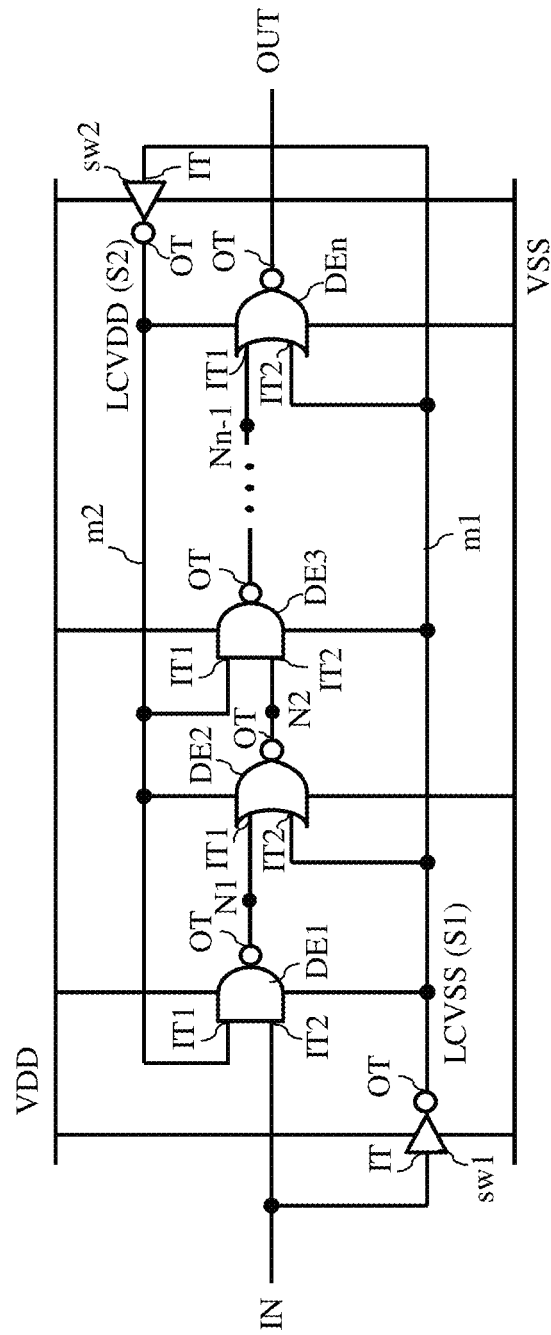
FIG. 3 is a schematic diagram of a delay circuit configured with respect to the delay circuit of FIGS. 1-2, in accordance with some embodiments of the present disclosure.

Reference is now made to FIG. 3. FIG. 3 is a schematic diagram of a delay circuit 20 configured with respect to the delay circuit 10 of FIGS. 1-2, in accordance with some embodiments of the present disclosure. With respect to the embodiments of FIGS. 1-2, like elements in FIG. 3 are designated with the same annotations for ease of understanding. The specific operations of similar elements, which are already discussed in detail in above paragraphs, are omitted herein for the sake of brevity.

As shown in FIG. 3, the power switches sw1 and sw2 are inverters. The delay elements DE1, DE3 . . . DEn−1 are NAND gates. The delay elements DE2, DE4 . . . DEn are NOR gates. The NAND gates and the NOR gates are coupled in series alternatively. The power source S1 is configured as the VSS source for the NAND gates. The power source S2 is configured as the VDD source for the NOR gates. For the ease of understanding, the power sources S1 and S2 are also annotated as a power sources LCVSS and LCVDD here.

The power switches sw1 and sw2 are coupled to a voltage VDD and a voltage VSS. The voltage VDD is configured as the VDD sources of the power switches sw1 and sw2. An input terminal IT of the power switch sw1 is coupled to the input terminal of the delay circuit 20 to receive the input signal IN. An output terminal OT of the power switch sw1 is coupled to the power source LCVSS. An input terminal IT of the power switch sw2 is coupled to the power source LCVSS. An output terminal OT of the power switch sw2 is coupled to the power source LCVDD.

The voltage VSS is configured as the VSS source of the power switches sw1 and sw2. Compared to the delay circuit 10, the delay elements DE1, DE3 . . . DEn−1 of the delay circuit 20 are coupled to the voltage VDD as the VDD source instead of coupled to the power source LCVDD as the VDD source. The delay elements DE2, DE4 . . . DEn of the delay circuit 20 are coupled to the voltage VSS as the VSS source instead of coupled to the power source LCVSS as the VSS source. The voltage VDD is supplied to the NAND gates to prevent nodes N1, N3, Nn−1 from being undefined when the input signal has the voltage level VL. The voltage VSS is supplied to the NOR gates to prevent nodes N2, N4, Nn from being undefined when the input signal has the voltage level VL.

Compared to the delay circuit 10, each delay element DE of the delay circuit 20 has an input terminal IT1 and an input terminal IT2. The input terminal IT1 of the delay element DE1 is coupled to the power source LCVDD. The input terminal IT2 is coupled to the input terminal of the delay circuit 20 to receive the input signal IN. The input terminal IT1 of the delay element DE2 is coupled to the output terminal OT of the delay element DE1. The input terminal IT2 of the delay element DE2 is coupled to the power source LCVSS. The input terminal IT1 of the delay element DE3 is coupled to the power source LCVDD. The input terminal IT2 of the delay element DE3 is coupled to the output terminal OT of the delay element DE2.

Similarly, an input terminal IT1 of each of the delay elements DE4, DE6 . . . DEn is coupled to the output terminal of a previous delay element DE. An input terminal IT2 of each of the delay elements DE4, DE6 . . . DEn is coupled to the power source LCVSS. An input terminal IT1 of each of the delay elements DE5, DE7 . . . DEn−1 is coupled to the power source LCVDD. An input terminal IT2 of each of the delay elements DE5, DE7 . . . DEn−1 is coupled to the output terminal of a previous delay element DE.

Figures 4A, 4B, 4C:
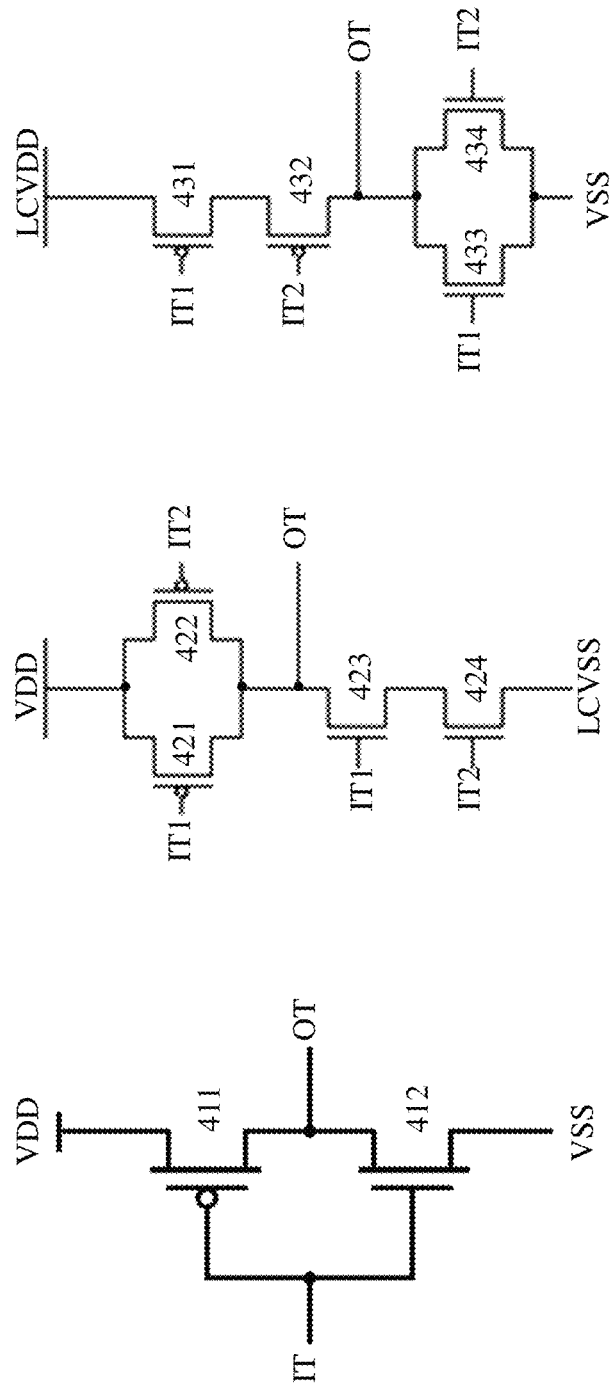
FIG. 4A is a schematic diagram corresponding to the power switches of the delay circuit of FIG. 3, in accordance with some embodiments of the present disclosure.
FIG. 4B is a schematic diagram corresponding to the delay elements of the delay circuit of FIG. 3, in accordance with some embodiments of the present disclosure.
FIG. 4C is a schematic diagram corresponding to the delay elements of the delay circuit of FIG. 3, in accordance with some embodiments of the present disclosure.

Reference is now further made to FIG. 4A to FIG. 4C. FIG. 4A is a schematic diagram corresponding to the power switches sw1 and sw2 of the delay circuit 20 of FIG. 3, in accordance with some embodiments of the present disclosure. FIG. 4B is a schematic diagram corresponding to the delay elements DE1, DE3 . . . DEn−1 of the delay circuit 20 of FIG. 3, in accordance with some embodiments of the present disclosure. FIG. 4C is a schematic diagram corresponding to the delay elements DE2, DE4 . . . DEn of the delay circuit 20 of FIG. 3, in accordance with some embodiments of the present disclosure.

As shown in FIG. 4A, in some embodiments, each of the power switches sw1 and sw2 is an inverter. Each of the power switches sw1 and sw2 includes a transistor 411 and a transistor 412. A source/drain terminal of the transistor 411 is coupled to the voltage VDD. A drain/source terminal of the transistor 411 is coupled to the output terminal OT. A gate (control) terminal of the transistor 411 is coupled to the input terminal IT. A source/drain terminal of the transistor 412 is coupled to the output terminal OT. A drain/source terminal of the transistor 412 is coupled to the voltage VSS. A gate (control) terminal of the transistor 412 is coupled to the input terminal IT. In some embodiments, the transistor 411 is a p-type metal-oxide-semiconductor field-effect transistor (PMOS) and the transistor 412 is an n type metal-oxide-semiconductor field-effect transistor (NMOS).

The transistor 411 pulls up the voltage level of the output terminal OT to the voltage level of the voltage VDD in response to the voltage level of the input terminal IT pulled down. The transistor 412 pulls down the voltage level of the output terminal OT to the voltage level of the voltage VSS in response to the voltage level of the input terminal IT pulled up.

As shown in FIG. 4B, in some embodiments, each of the delay elements DE1, DE3 . . . DEn−1 is a NAND gate. Each of the delay elements DE1, DE3 . . . DEn−1 includes transistors 421 to 424. For illustration, a source/drain terminal of the transistor 421 is coupled to the voltage VDD. A drain/source terminal of the transistor 421 is coupled to the output terminal OT. A gate terminal of the transistor 421 is coupled to the input terminal IT1. Similarly, a source/drain terminal of the transistor 422 is coupled to the voltage VDD.

A drain/source terminal of the transistor 422 is coupled to the output terminal OT. A gate terminal of the transistor 422 is coupled to the input terminal IT2.

A source/drain terminal of the transistor 423 is coupled to the output terminal OT. A gate terminal of the transistor 423 is coupled to the input terminal IT1. A source/drain terminal of the transistor 424 is coupled to a drain/source terminal of the transistor 423. A drain/source terminal of the transistor 424 is coupled to the power source LCVSS. A gate terminal of the transistor 424 is coupled to the input terminal IT2.

The transistor 421 pulls up the voltage level of the output terminal OT to the voltage level of the voltage VDD in response to the voltage level of the input terminal IT1 pulled down. Similarly, the transistor 422 pulls up the voltage level of the output terminal OT to the voltage level of the voltage VDD in response to the voltage level of the input terminal IT2 pulled down.

The transistors 423-424 pulls down the voltage level of the output terminal OT to the voltage level of the power source LCVSS in response to the voltage levels of the input terminals IT1 and IT2 are both pulled up.

As shown in FIG. 4C, in some embodiments, each of the delay elements DE2, DE4 . . . DEn is a NOR gate. Each of the delay elements DE2, DE4 . . . DEn includes transistors 431 to 434. For illustration, a source/drain terminal of the transistor 431 is coupled to the power source LCVDD. A gate terminal of the transistor 431 is coupled to the input terminal IT1. A source/drain terminal of the transistor 432 is coupled to a drain/source terminal of the transistor 431. A drain/source terminal of the transistor 432 is coupled to the output terminal OT. A gate terminal of the transistor 432 is coupled to the input terminal IT2.

A source/drain terminal of the transistor 433 is coupled to the output terminal OT. A drain/source terminal of the transistor 433 is coupled to the voltage VSS. A gate terminal of the transistor 433 is coupled to the input terminal IT1. Similarly, a source/drain terminal of the transistor 434 is coupled to the output terminal OT. A drain/source terminal of the transistor 434 is coupled to the voltage VSS. A gate terminal of the transistor 434 is coupled to the input terminal IT2.

The transistors 431-432 pulls up the voltage level of the output terminal OT to the voltage level of the power source LCVDD in response to the voltage levels of the input terminals IT1 and IT2 are both pulled down.

The transistor 433 pulls down the voltage level of the output terminal OT to the voltage level of the voltage VSS in response to the voltage level of the input terminal IT1 pulled up. Similarly, the transistor 422 pulls down the voltage level of the output terminal OT to the voltage level of the voltage VSS in response to the voltage level of the input terminal IT2 pulled up.

Figure 5:
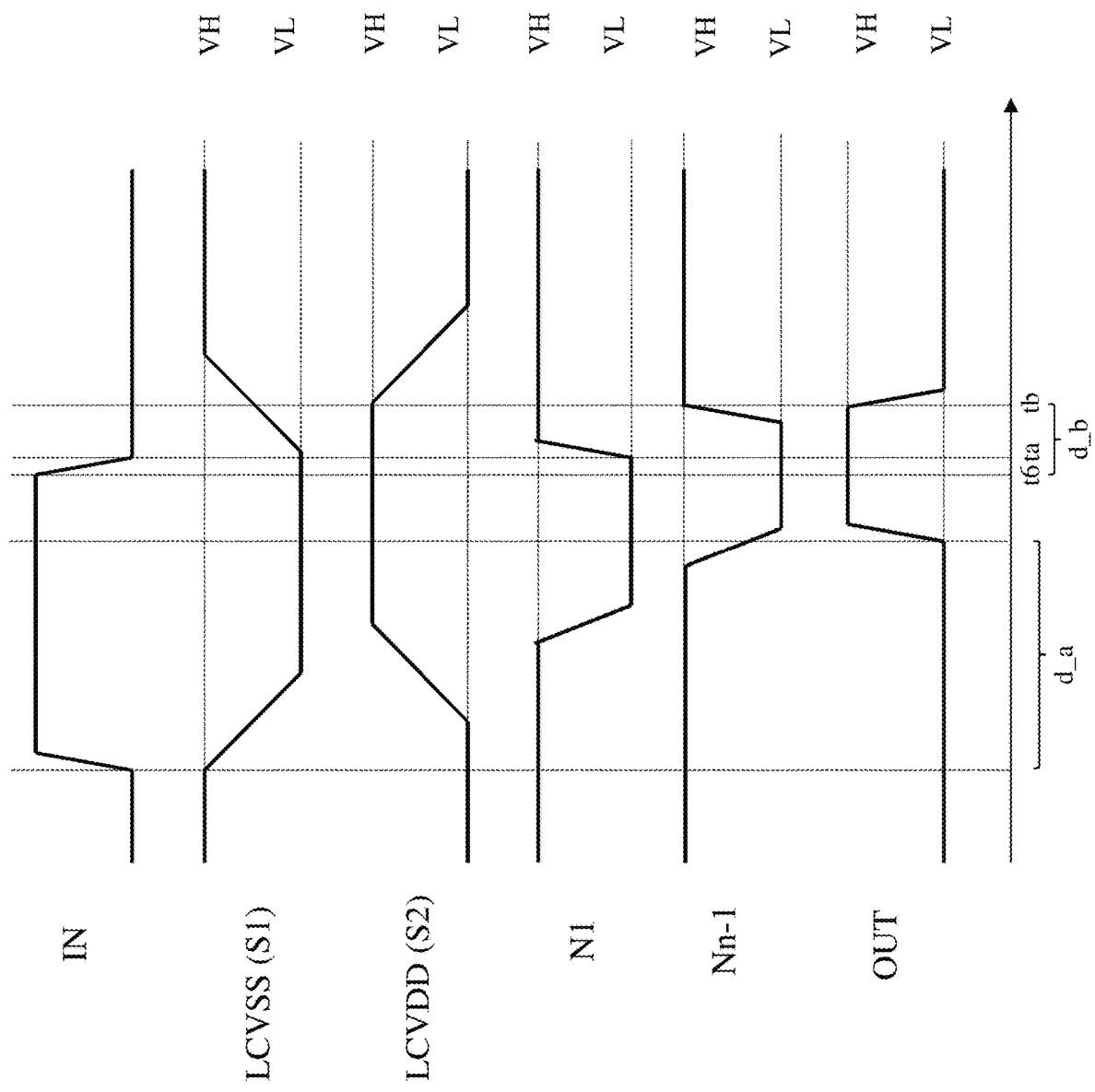
FIG. 5 is a timing diagram of voltage levels of signals corresponding to the delay circuit 20 of FIGS. 3 and 4A-4C, in accordance with some embodiments of the present disclosure.

Reference is now made to FIGS. 3, 4A-4C and 5. FIG. 5 is a timing diagram of voltage levels of the input signal IN, the output signal OUT, the node N1, the node Nn−1, the power source S1 and the power source S2 corresponding to the delay circuit 20 of FIGS. 3 and 4A-4C, in accordance with some embodiments of the present disclosure.

As shown in FIG. 5, similar to the delay operation of the delay circuit 10 described in the paragraphs corresponding to FIG. 2, the delay circuit 20 pulls up the output signal OUT according to the rising of the input signal IN with the delay time d_a. The voltage level of the power source LCVDD is pulled up according to the input signal IN. The delay element DE1 pulls down the voltage level of the node N1 in response to the voltage level of the power source LCVDD being pulled up to a high enough voltage level (e.g., voltage level in the voltage level range corresponding to the high logic state of the NAND gate). Then, the subsequent delay elements DE2-DEn propagate and delay the input signal. In other words, when the input signal IN is asserted, the input signal IN is propagated through the metal lines m1-m2, the power switches sw1-sw2 and the delay elements DE1-DEn to generate the output signal OUT with the delay time d_a.

Different from the delay circuit 10, the delay element DE1 of the delay circuit 20 pulls up the voltage level of the node N1 in response to the voltage level of the input signal IN pulled down to a low enough voltage level (e.g., voltage level in the voltage level range corresponding to the low logic state of the NAND gate) instead of the voltage level of the power source LCVSS (S1) pulled up and the power source LCVDD (S2) pulled down.

For example, at a time ta, the delay element DE1 pulls up the voltage level of the node N1 from the voltage level VL to the voltage level VH in response to the input signal pulled down at the time t6. Then, the delay elements propagate received signal as described in the previous paragraphs corresponding to FIG. 2. At a time tb, the delay element DEn pulls down the voltage level of the output signal OUT from the voltage level VH to the voltage level VL in response to the voltage level of the node Nn−1 pulled up.

As a result, the delay circuit 20 pulls down the output signal OUT according to the falling of the input signal IN with the delay time d_b. In other words, when the input signal IN is negated, the input signal IN is propagated through the delay elements without the metal lines m1-m2 and the power switches sw1-sw2 to generate the output signal OUT with the delay time d_b.

According to various embodiments, the transition of the NAND gate (delay elements DE1, DE3 . . . DEn−1) pulling up the voltage level of the output terminal OT by the voltage VDD is faster than the transition of the NAND gate pulling down the voltage level of the output terminal OT by the power source LCVSS because the voltage VDD is a strong supply while the power source LCVSS is a weak supply.

Similarly, the transition of the NOR gate (delay elements DE2, DE4 . . . DEn) pulling down the voltage level of the output terminal OT by the voltage VSS is faster than the transition of the NOR gate pulling up the voltage level of the output terminal OT by the power source LCVDD because the voltage VSS is a strong supply while the power source LCVDD is a weak supply.

As a result, in the embodiments of the delay circuit 20, the delay time d_b is shorter than the delay time d_a.

Figure 6A:
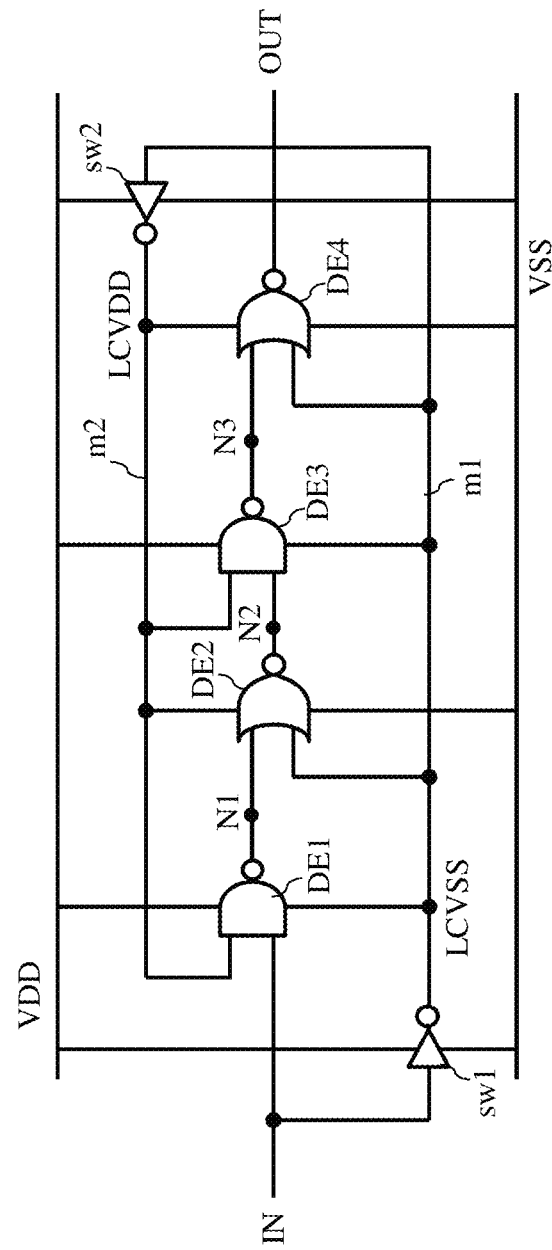
FIG. 6A is a schematic diagram of a delay circuit configured with respect to the delay circuit of FIGS. 1-3, 4A-4C, 5, in accordance with some embodiments of the present disclosure.
Figure 6B:
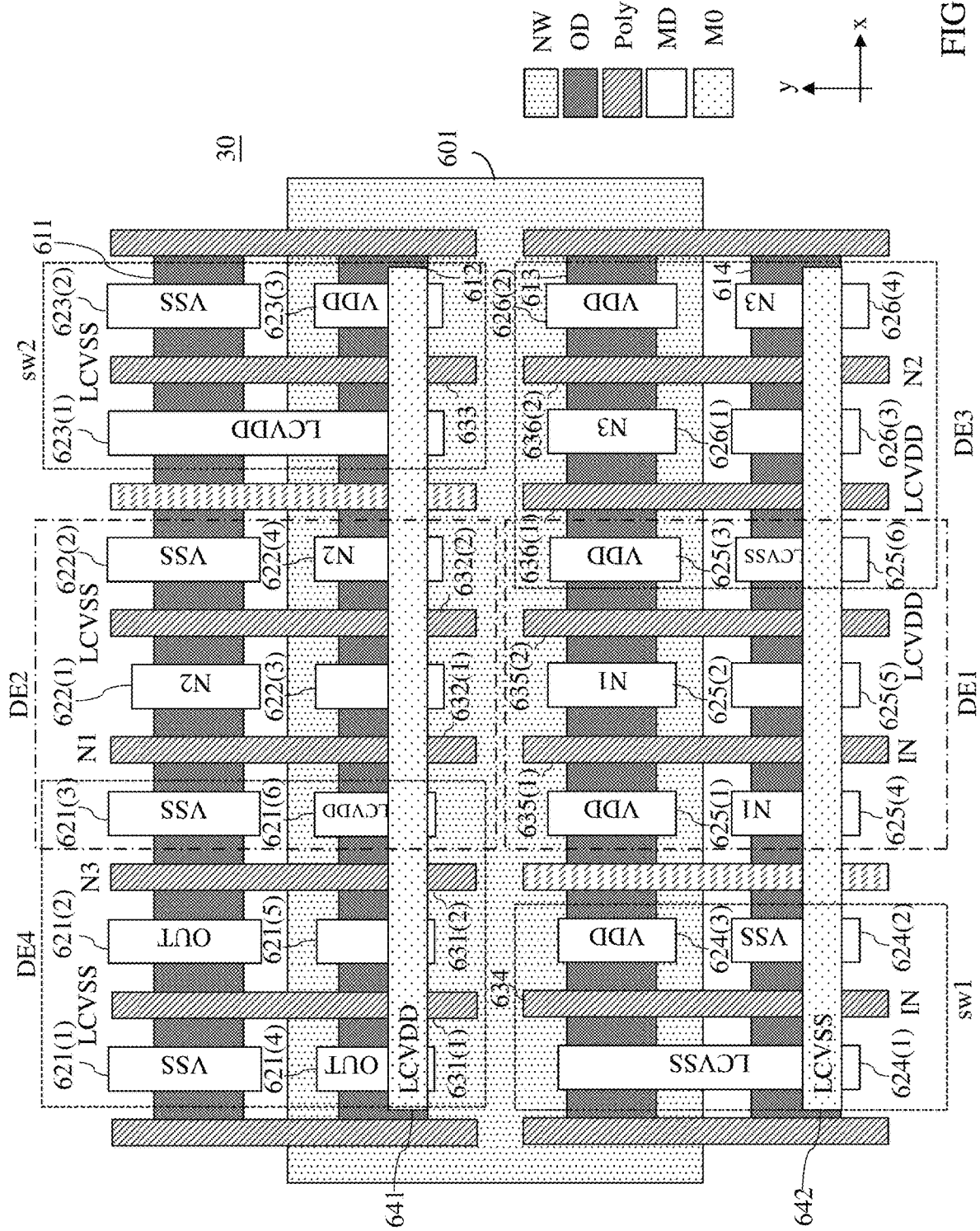
FIG. 6B is a layout diagram of the delay circuit of FIG. 6A in a top view, in accordance with some embodiments of the present disclosure.

Reference is now made to FIGS. 6A-6B. FIG. 6A is a schematic diagram of a delay circuit 30 configured with respect to the delay circuit 10 of FIGS. 1-2 and the delay circuit 20 of FIGS. 3, 4A-4C, 5, in accordance with some embodiments of the present disclosure. FIG. 6B is a layout diagram of the delay circuit 30 of FIG. 6A in a top view, in accordance with some embodiments of the present disclosure. With respect to the embodiments of FIGS. 1-3, 4A-4C, 5, like elements in FIGS. 6A-6B are designated with the same annotations for ease of understanding. The specific operations of similar elements, which are already discussed in detail in above paragraphs, are omitted herein for the sake of brevity.

Compared to the delay circuit 20 in FIG. 3, the delay circuit 30 in FIGS. 6A-6B has four delay elements DE. In other words, the delay circuit 30 is the delay circuit 20 with "n" equal to four.

In some embodiments, the delay circuit 30 is a semiconductor device. As shown in FIG. 6B, the delay circuit 30 includes a n-type well 601, active regions 611-614, conductive segments 621(1)-621(6), 622(1)-622(4), 623(1)-623(3), 624(1)-624(3), 625(1)-625(6), 626(1)-626(4), gate structures 631(1), 631(2), 632(1), 632(2), 633, 634, 635(1), 635(2), 636(1), 636(2) and metal lines 641, 642.

In some embodiments, the n-type well 601 is in a substrate. In some embodiments, the active regions 611-614 are oxide-definition (OD) regions. The active regions 611-614 are in an OD layer. In some embodiments, the active regions 611, 614 are in the substrate. The active regions 612-613 are in the n-type well 601.

In some embodiments, the conductive segments 621(1)-621(6), 622(1)-622(4), 623(1)-623(3), 624(1)-624(3), 625(1)-625(6), 626(1)-626(4) are metal-to-device (MD) conductive segments in a MD layer above the OD layer. In some embodiments, the gate structures 631(1), 631(2), 632(1), 632(2), 633, 634, 635(1), 635(2), 636(1), 636(2) are polysilicon (Poly) structures in a Poly layer above the OD layer. The metal lines 641, 642 are in a metal-zero (MO) layer above the MD layer and the Poly layer.

The n-type well 601 extends along a direction x. The active regions 611-614 extend along the direction x and are separated from each other along a direction y perpendicular to the direction x. The active regions 612-613 are above the n-type well 601 and are surrounded by the n-type well in the top view.

The conductive segments 621(1)-621(6), 622(1)-622(4), 623(1)-623(3), 624(1)-624(3), 625(1)-625(6), 626(1)-626(4) extend along the direction y. The conductive segments 621(1)-621(3), 622(1)-622(2), 623(2) are above the active region 611 and coupled to the active region 611. The conductive segments 621(4)-621(6), 622(3)-622(4), 623(3) are above the active region 612 and coupled to the active region 612. The conductive segment 623(1) extends across the active regions 611 and 612. The conductive segment 623(1) is coupled to the active regions 611 and 612. The conductive segments 624(3), 625(1)-625(3), 626(1)-626(2) are above the active region 613 and coupled to the active region 613. The conductive segments 624(2), 625(4)-625(6), 626(3)-626(4) are above the active region 614 and coupled to the active region 614. The conductive segment 624(1) extends across the active regions 613 and 614. The conductive segment 624(1) is coupled to the active regions 613 and 614.

The conductive segments 621(1)-621(3), 622(1)-622(2), 623(1)-623(2) are separated from each other along the direction x. The conductive segments 621(4)-621(6), 622(3)-622(4), 623(1), 623(3) are separated from each other along the direction x. The conductive segments 624(1), 624(3), 625(1)-625(3), 626(1)-626(2) are separated from each other along the direction x. The conductive segments 624(1)-624(2), 625(4)-625(6), 626(3)-626(4) are separated from each other along the direction x.

The gate structures 631(1), 631(2), 632(1), 632(2), 633, 634, 635(1), 635(2), 636(1), 636(2) extend along the direction y. The gate structures 631(1), 631(2), 632(1), 632(2), 633 extend across the active regions 611 and 612 and are coupled to the active regions 611 and 612. The gate structures 634, 635(1), 635(2), 636(1), 636(2) extend across the active regions 613 and 614 and are coupled to the active regions 613 and 614.

The gate structures 631(1), 631(2), 632(1), 632(2), 633 are separated from each other along the direction x. The gate structures 634, 635(1), 635(2), 636(1), 636(2) are separated from each other along the direction x. The gate structures 631(1), 631(2), 632(1), 632(2), 633 and the gate structures 634, 635(1), 635(2), 636(1), 636(2) are separated along the direction y.

The metal lines 641-642 extend along the direction x and are separated from each other along the direction y. The metal line 641 extends across the conductive segments 621(6) and 623(1) and is coupled to the conductive segments 621(6) and 623(1). The metal line 642 extends across the conductive segments 624(1) and 625(6) and is coupled to the conductive segments 624(1) and 625(6).

In some embodiments, the gate structure 634 corresponds to the input terminal IT of the power switch sw1 and receives the input signal IN. The conductive segment 624(3) corresponds to the power terminal of the power switch sw1 to receive the voltage VDD. The conductive segment 624(2) corresponds to the power terminal of the power switch sw1 to receive the voltage VSS. The conductive segment 624(1) corresponds to the output terminal OT of the power switch sw1 to provide the power source LCVSS.

In some embodiments, the metal line 642 is coupled to the power source LCVSS to transmit the voltage of the power source LCVSS. In some embodiments, the metal line 642 corresponds to the metal line m1.

In some embodiments, the gate structure 633 corresponds to the input terminal IT of the power switch sw2 and is coupled to the power source LCVSS. The conductive segment 623(2) corresponds to the power terminal of the power switch sw2 to receive the voltage VSS. The conductive segment 623(3) corresponds to the power terminal of the power switch sw2 to receive the voltage VDD. The conductive segment 623(1) corresponds to the output terminal OT of the power switch sw2 to provide the power source LCVDD.

In some embodiments, the metal line 641 is coupled to the power source LCVDD to transmit the voltage of the power source LCVDD. In some embodiments, the metal line 641 corresponds to the metal line m2.

In some embodiments, the gate structure 635(1) corresponds to the input terminal IT2 of the delay element DE1 to receive the input signal IN. The gate structure 635(2) corresponds to the input terminal IT1 of the delay element DE1 and is coupled to the power source LCVDD. The conductive segments 625(1) and 625(3) correspond to the power terminals of the delay element DE1 to receive the voltage VDD. The conductive segment 625(6) corresponds to the power terminals of the delay element DE1 and is coupled to the power source LCVSS. The conductive segments 625(2) and 625(4) correspond to the output terminal OT of the delay element DE1 and the node N1.

In some embodiments, the gate structure 632(1) corresponds to the input terminal IT1 of the delay element DE2 and is coupled to the node N1. The gate structure 632(2) corresponds to the input terminal IT2 of the delay element DE2 and is coupled to the power source LCVSS. The conductive segments 621(3) and 622(2) correspond to the power terminals of the delay element DE2 to receive the voltage VSS. The conductive segment 621(6) corresponds to the power terminal of the delay element DE2 that is coupled to the power source LCVDD. The conductive segments 622(1) and 622(4) correspond to the output terminal OT of the delay element DE2 and the node N2.

In some embodiments, the gate structure 636(2) corresponds to the input terminal IT2 of the delay element DE3 and is coupled to the node N2. The gate structure 636(1) corresponds to the input terminal IT2 of the delay element DE3 and is coupled to the power source LCVDD. The conductive segments 625(3) and 626(2) correspond to the power terminals of the delay element DE3 to receive the voltage VDD. The conductive segment 625(6) further corresponds to the power terminals of the delay element DE3 that is coupled to the power source LCVSS. The conductive segments 626(1) and 626(4) correspond to the output terminal OT of the delay element DE3 and the node N3.

In some embodiments, the gate structure 631(2) corresponds to the input terminal IT1 of the delay element DE4 is coupled to the node N1. The gate structure 631(1) corresponds to the input terminal IT2 of the delay element DE4 and is coupled to the power source LCVSS. The conductive segments 621(1) and 621(3) correspond to the power terminals of the delay element DE4 to receive the voltage VSS. The conductive segment 621(6) further corresponds to the power terminal of the delay element DE4 that is coupled to the power source LCVDD. The conductive segments 621(2) and 621(4) correspond to the output terminal OT of the delay element DE4 to generate the output signal OUT.

In some embodiments, the gate structures 631(1), 632(2), 633 are coupled to the metal line 642 through metal lines and vias to receive the voltage of the power source LCVSS. The gate structures 635(2), 636(1) are coupled to the metal line 641 through metal lines and vias to receive the voltage of the power source LCVDD.

In some embodiments, the conductive segments 625(2), 625(4) and the gate structure 632(1) are coupled together as the node N1 through metal lines and vias. The conductive segments 622(1), 622(4) and the gate structure 636(2) are coupled together as the node N2 through metal lines and vias. The conductive segments 626(1), 626(4) and the gate structure 631(2) are coupled together as the node N3 through metal lines and vias.

In some embodiments, the semiconductor devices of the delay circuit 20 with different number of delay elements (e.g., "n" equal to six, etc.) are configured in a similar way, as described in the previous paragraphs corresponding to FIG. 6B.

Figure 7:
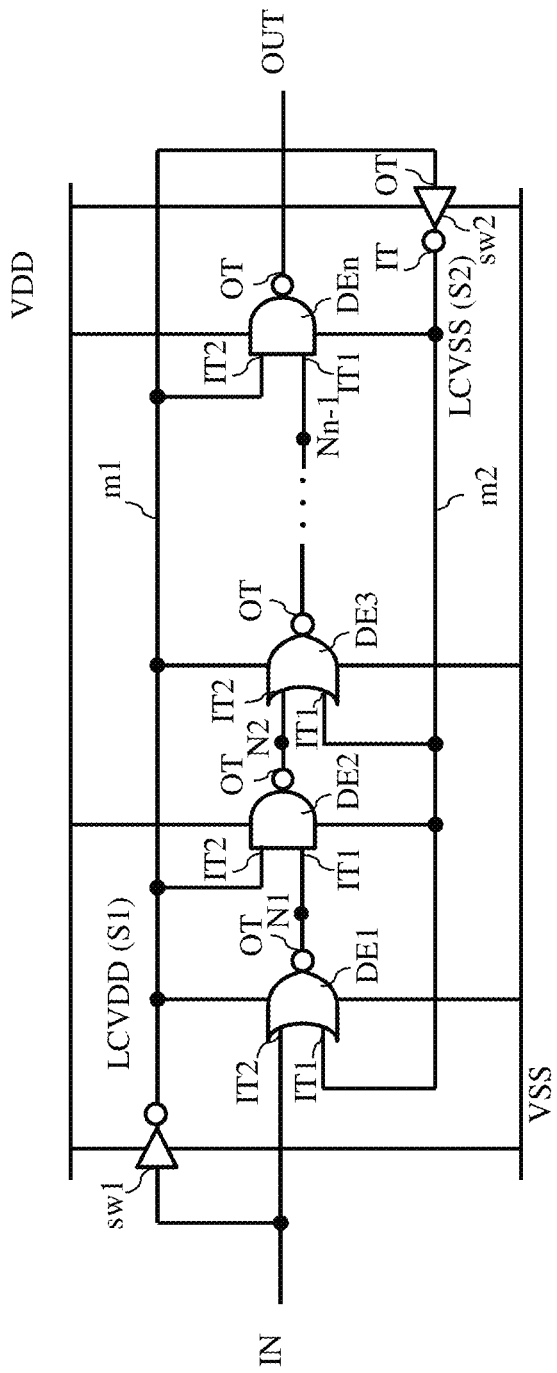
FIG. 7 is a schematic diagram of a delay circuit configured with respect to the delay circuit of FIGS. 1-3, 4A-4C, 5, 6A-6B, in accordance with some embodiments of the present disclosure.

Reference is now made to FIG. 7. FIG. 7 is a schematic diagram of a delay circuit 40 configured with respect to the delay circuit 10 of FIGS. 1-2, the delay circuit 20 of FIGS. 3, 4A-4C, 5, the delay circuit 30 of FIGS. 6A-6B, in accordance with some embodiments of the present disclosure. With respect to the embodiments of FIGS. 1-3, 4A-4C, 5, 6A-6B like elements in FIG. 7 are designated with the same annotations for ease of understanding. The specific operations of similar elements, which are already discussed in detail in above paragraphs, are omitted herein for the sake of brevity.

Different from the delay elements DE1-DEn of the delay circuits 10-30, the delay elements DE1, DE3 . . . DEn−1 are NOR gates and the delay elements DE2, DE4 . . . DEn are NAND gates.

Different from the power source S1 of the delay circuits 10-30, the power source S1 of the delay circuit 40 is configured as the VDD source of the NOR gates. For the ease of understanding, the power source S1 of the delay circuit 40 is also annotated as the power source LCVDD. Similarly, the power source S2 of the delay circuit 40 is configured as the VSS source of the NAND gates. For the ease of understanding, the power source S2 of the delay circuit 40 is also annotated as the power source LCVSS.

Figure 8:
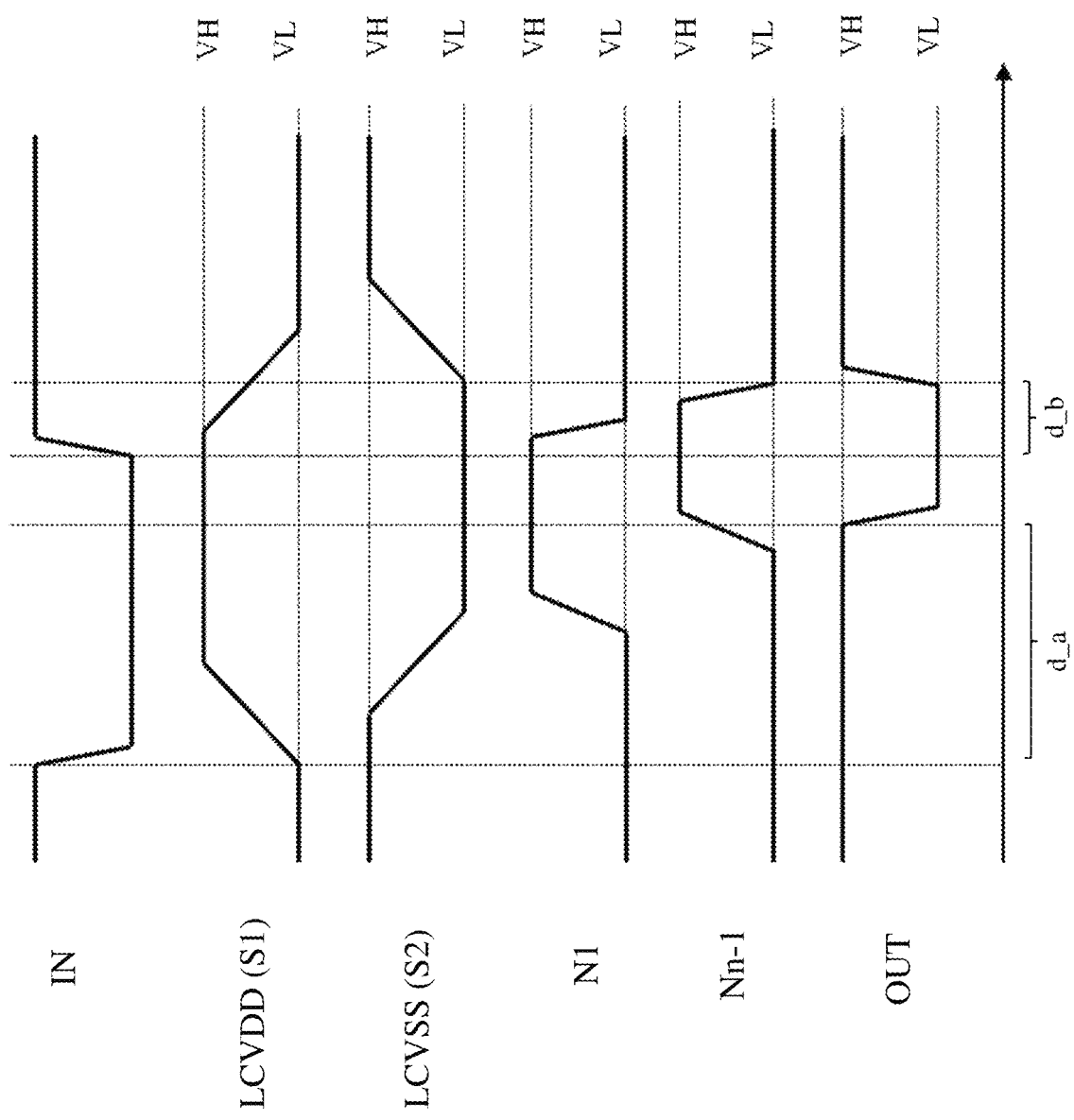
FIG. 8 is a timing diagram of voltage levels of signals corresponding to the delay circuit of FIG. 8, in accordance with some embodiments of the present disclosure.

Reference is now made to FIG. 8. FIG. 8 is a timing diagram of voltage levels of the input signal IN, the output signal OUT, the node N1, the node Nn−1, the power source S1 and the power source S2 corresponding to the delay circuit 40 of FIG. 8, in accordance with some embodiments of the present disclosure.

The delay operation of the delay circuit 40 is inverted to the delay operation of the delay circuit 20 as described in the paragraphs corresponding to FIG. 5. For example, the delay circuit 40 pulls down the output signal OUT according to the falling of the input signal IN with the delay time d_a. In other words, when the input signal IN is negated, the input signal IN is propagated through the metal lines m1-m2, the power switches sw1-sw2 and the delay elements to generate the output signal OUT with the delay time d_a.

The delay element DE1 pulls down the voltage level of the node N1 from the voltage level VH to the voltage level VL in response to the input signal pulled up. Then, the delay elements propagate received signal and the delay element DEn pulls up the voltage level of the output signal OUT from the voltage level VL to the voltage level VH in response to the voltage level of the node Nn−1 pulled down.

The delay circuit 40 pulls up the output signal OUT according to the rising of the input signal IN with the delay time d_b. When the input signal IN is asserted, the input signal IN is propagated through the delay elements without the metal lines m1-m2 and the power switches sw1-sw2 to generate the output signal OUT with the delay time d_b.

Similar to the delay circuit 20, in the embodiments of the delay circuit 40, the delay time d_b is shorter than the delay time d_a.

Figure 9A:
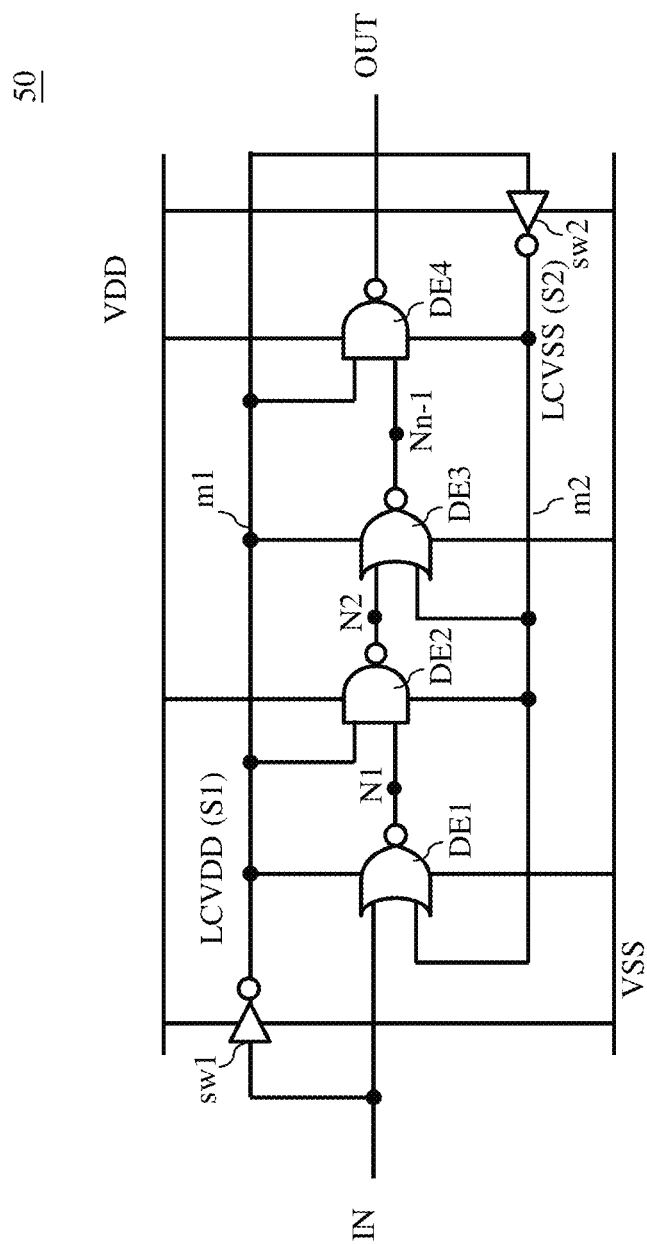
FIG. 9A is a schematic diagram of a delay circuit configured with respect to the delay circuit of FIGS. 1-2, 7-8, in accordance with some embodiments of the present disclosure.
Figure 9B:
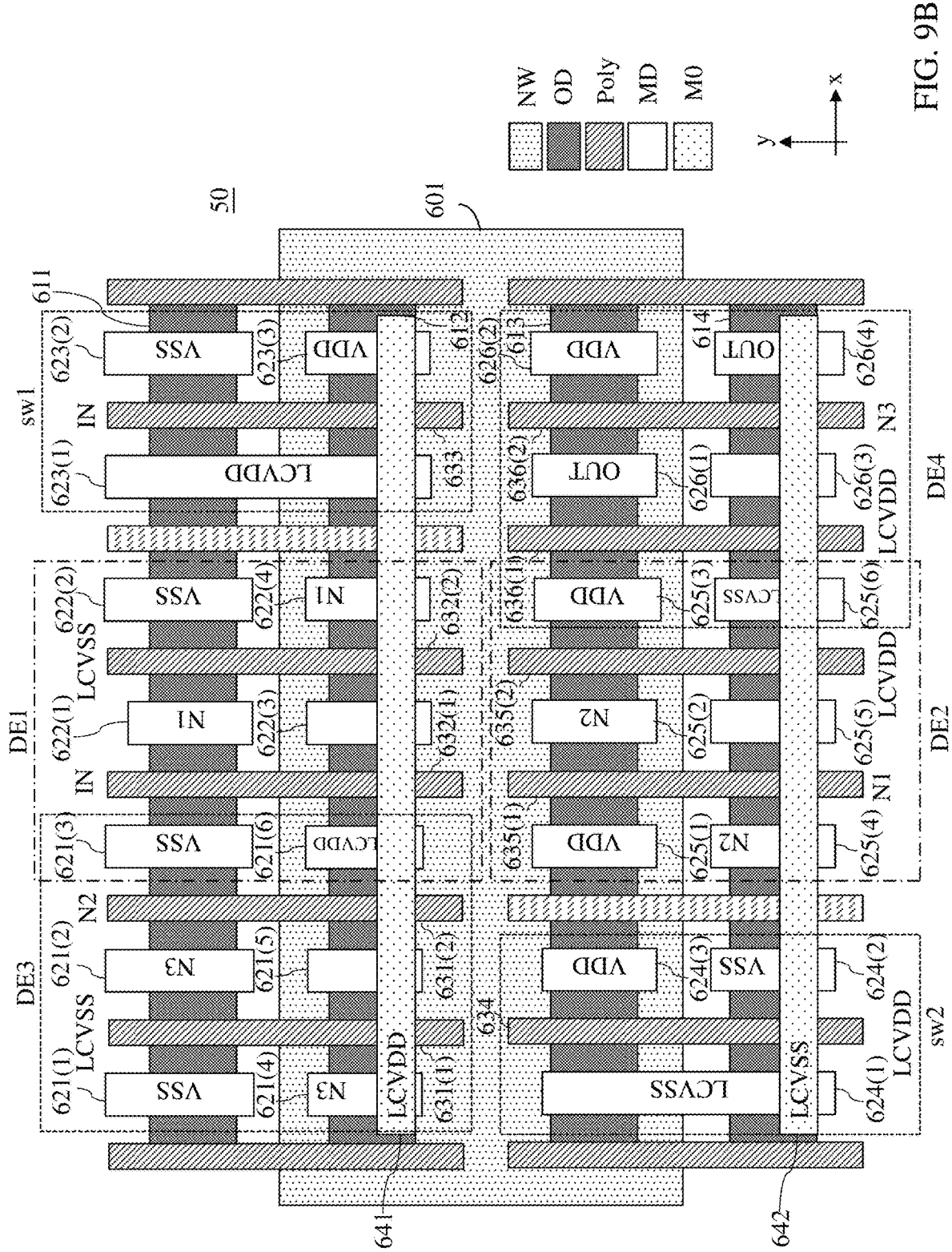
FIG. 9B is a layout diagram of the delay circuit of FIG. 6A in a top view, in accordance with some embodiments of the present disclosure.

Reference is now made to FIGS. 9A-9B. FIG. 9A is a schematic diagram of a delay circuit 50 configured with respect to the delay circuit 10 of FIGS. 1-2 and the delay circuit 40 of FIGS. 7, 8, in accordance with some embodiments of the present disclosure. FIG. 9B is a layout diagram of the delay circuit 50 of FIG. 6A in a top view, in accordance with some embodiments of the present disclosure. With respect to the embodiments of FIGS. 1-3, 4A-4C, 5, 6A-6B, 7-8, like elements in FIGS. 9A-9B are designated with the same annotations for ease of understanding. The specific operations of similar elements, which are already discussed in detail in above paragraphs, are omitted herein for the sake of brevity.

Compared to the delay circuit 40 in FIG. 7, the delay circuit 50 in FIGS. 9A-9B has four delay elements DE. In other words, the delay circuit 50 is the delay circuit 40 with "n" equal to four.

In some embodiments, the semiconductor device of the delay circuit 50 is configured with respect to the semiconductor device of delay circuit 30. The layout of the delay circuit 50 in FIG. 9B is similar to the layout of the delay circuit 30 in FIG. 6B.

In some embodiments of the delay circuit 50, the gate structure 633 corresponds to the input terminal IT of the power switch sw1 and is coupled to the input signal IN. The conductive segment 623(2) corresponds to the power terminal of the power switch sw1 to receive the voltage VSS. The conductive segment 623(3) corresponds to the power terminal of the power switch sw1 to receive the voltage VDD. The conductive segment 623(1) corresponds to the output terminal OT of the power switch sw1 to provide the power source LCVDD.

In some embodiments, the metal line 641 is coupled to the power source LCVDD to transmit the voltage of the power source LCVDD. In some embodiments, the metal line m1 includes the metal line 641.

In some embodiments, the gate structure 634 corresponds to the input terminal IT of the power switch sw2 and is coupled to the power source LCVDD. The conductive segment 624(3) corresponds to the power terminal of the power switch sw2 to receive the voltage VDD. The conductive segment 624(2) corresponds to the power terminal of the power switch sw2 to receive the voltage VSS. The conductive segment 624(1) corresponds to the output terminal OT of the power switch sw2 to provide the power source LCVSS.

In some embodiments, the metal line 642 is coupled to the power source LCVSS to transmit the voltage of the power source LCVSS. In some embodiments, the metal line m2 includes the metal line 642.

In some embodiments, the gate structure 632(1) corresponds to the input terminal IT2 of the delay element DE1 and receives the input signal IN. The gate structure 632(2) corresponds to the input terminal IT1 of the delay element DE1 and is coupled to the power source LCVSS. The conductive segments 621(3) and 622(2) correspond to the power terminals of the delay element DE1 to receive the voltage VSS. The conductive segment 621(6) corresponds to the power terminal of the delay element DE1 that is coupled to the power source LCVDD. The conductive segments 622(1) and 622(4) correspond to the output terminal OT of the delay element DE1 and the node N1.

In some embodiments, the gate structure 635(1) corresponds to the input terminal IT1 of the delay element DE2 and is coupled to the node N1. The gate structure 635(2) corresponds to the input terminal IT2 of the delay element DE2 and is coupled to the power source LCVDD. The conductive segments 625(1) and 625(3) correspond to the power terminals of the delay element DE2 to receive the voltage VDD. The conductive segment 625(6) corresponds to the power terminals of the delay element DE2 and is coupled to the power source LCVSS. The conductive segments 625(2) and 625(4) correspond to the output terminal OT of the delay element DE2 and the node N2.

In some embodiments, the gate structure 631(2) corresponds to the input terminal IT2 of the delay element DE3 is coupled to the node N2. The gate structure 631(1) corresponds to the input terminal IT1 of the delay element DE3 and is coupled to the power source LCVSS. The conductive segments 621(1) and 621(3) correspond to the power terminals of the delay element DE3 to receive the voltage VSS. The conductive segment 621(6) further corresponds to the power terminal of the delay element DE3 that is coupled to the power source LCVDD. The conductive segments 621(2) and 621(4) correspond to the output terminal OT of the delay element DE3 and the node N3.

In some embodiments, the gate structure 636(2) corresponds to the input terminal IT2 of the delay element DE4 and is coupled to the node N3. The gate structure 636(1) corresponds to the input terminal IT1 of the delay element DE4 and is coupled to the power source LCVDD. The conductive segments 625(3) and 626(2) correspond to the power terminals of the delay element DE4 to receive the voltage VDD. The conductive segment 625(6) further corresponds to the power terminal of the delay element DE4 that is coupled to the power source LCVDD. The conductive segments 626(1) and 626(4) correspond to the output terminal OT of the delay element DE4 to generate the output signal OUT.

In some embodiments, the conductive segments 622(1), 622(4) and the gate structure 635(1) are coupled together as the node N1 through metal lines and vias. The conductive segments 625(2), 625(1) and the gate structure 631(2) are coupled together as the node N2 through metal lines and vias. The conductive segments 621(2), 621(4) and the gate structure 636(2) are coupled together as the node N3 through metal lines and vias.

In some embodiments, the semiconductor devices of the delay circuit 40 with different number of delay elements (e.g., "n" equal to six, etc.) are configured in a similar way, as described in the previous paragraphs corresponding to FIG. 9B.

Figure 10:
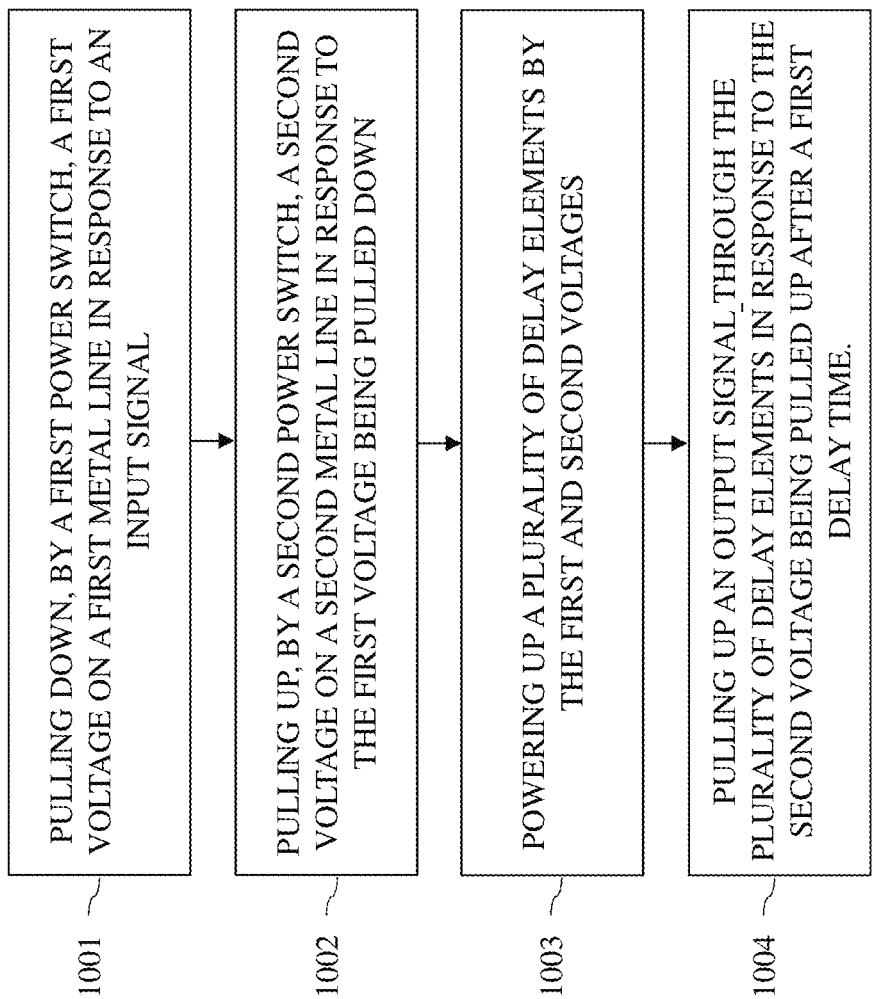
FIG. 10 is a flow chart diagram of a method for operating the delay circuit, in accordance with some embodiments of the present disclosure.

Reference is now made to FIG. 10. FIG. 10 is a flowchart diagram of a method 1000 for operating the delay circuit 10, 20, 30, 40 and 50, in accordance with some embodiments of the present disclosure. It is understood that additional operations can be provided before, during, and after the operations shown by FIG. 10, and some of the operations described below can be replaced or eliminated, for additional embodiments of the method 1000. The order of the steps may be interchangeable. Throughout the various views and illustrative embodiments, like reference numbers are used to designate like elements. The method 1000 includes operations 1001-1004 that are described below with reference to the delay circuit 10, 20, 30, 40 and 50 corresponding to FIGS. 1-3, 4A-4C, 5, 6A-6B, 7-8, 9A-9B.

In the operation 1001, the power switch sw1 pulls down a voltage level of the metal line m1 in response to the input signal being pulled up.

In the operation 1002, the power switch sw1 pulls up a voltage level of the metal line m2 in response to the voltage level of the metal line m1 being pulled down to a low enough voltage level (within the range of the voltage level corresponding to the low state of the power switch sw1).

In the operation 1003, the voltages on the metal lines m1 and m2 power up the delay elements DE. The pulled up voltage of the metal line m2 is configured as a high supply voltage of the delay elements DE. The pulled down voltage of the metal line m1 is configured as a low supply voltage of the delay elements DE. The delay elements DE operate (propagate and delay received signal) when the voltage level on the metal line m1 is pulled down enough and the voltage level on the metal line m2 is pulled up enough to provide a working voltage for the delay elements DE.

In the operation 1004, the delay elements DE pull up the output signal OUT in response to the voltage level of the metal line m2 being pulled up after a first delay time (e.g., a time period between the time t2 and the time t5 in FIG. 2).

In some embodiments, the input signal IN is transmitted to the delay elements DE. The delay elements DE pull down the output signal OUT in response to the input signal being pulled down after a second delay time (e.g., delay time d_b).

Figure 11:
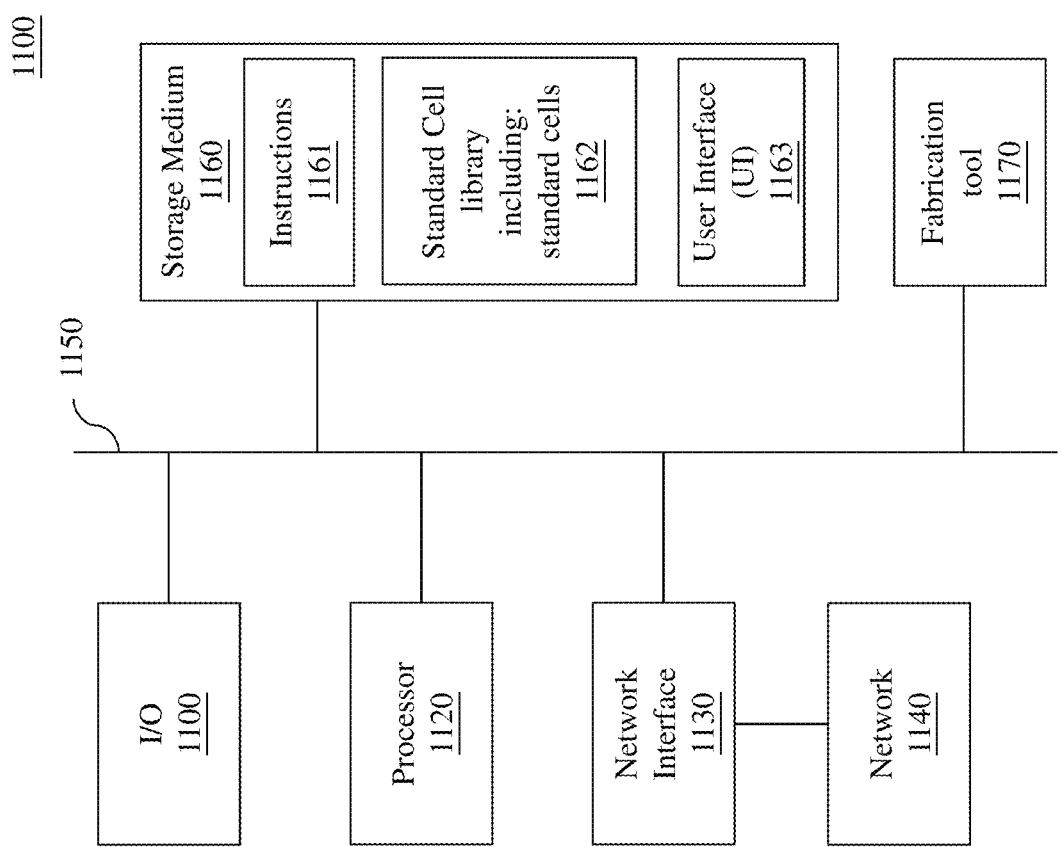
FIG. 11 is a block diagram of an electronic design automation (EDA) system for designing the integrated circuit layout design, in accordance with some embodiments of the present disclosure.

Reference is now made to FIG. 11. FIG. 11 is a block diagram of an electronic design automation (EDA) system 1100 for designing the integrated circuit layout design, in accordance with some embodiments of the present disclosure. The EDA system 1100 is configured to implement layout design disclosed in FIGS. 6B and 9B.

In some embodiments, the EDA system 1100 is a general purpose computing device including a hardware processor 1120 and a non-transitory, computer-readable storage medium 1160. The storage medium 1160, amongst other things, is encoded with, i.e., stores, instructions (computer program code) 1161, i.e., a set of executable instructions. Execution of the instructions 1161 by hardware processor 1120 represents (at least in part) an EDA tool which implements a portion or all of, e.g., the methods for implementing layout design disclosed in FIGS. 6B and 9B.

The processor 1120 is electrically coupled to the storage medium 1160 via a bus 1150. The processor 1120 is also electrically coupled to an input/output (I/O) interface 1110 and a fabrication tool 1170 by bus 1150. A network interface 1130 is also electrically connected to processor 1120 via bus 1150. Network interface 1130 is connected to a network 1140, so that processor 1120 and the storage medium 1160 are capable of connecting to external elements via the network 1140. The processor 1120 is configured to execute the instructions 1161 encoded in the storage medium 1160 in order to cause the EDA system 1100 to be usable for performing a portion or all of the noted processes and/or methods. In one or more embodiments, the processor 1120 is a central processing unit (CPU), a multi-processor, a distributed processing system, an application specific integrated circuit (ASIC), and/or a suitable processing unit.

In one or more embodiments, the storage medium 1160 is an electronic, magnetic, optical, electromagnetic, infrared, and/or a semiconductor system (or apparatus or device). For example, the storage medium 1160 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage medium 1160 includes a compact disk-read only memory (CD-ROM), a compact disk-read/write (CD-R/W), and/or a digital video disc (DVD).

In one or more embodiments, the storage medium 1160 stores the instructions 1161 configured to cause the EDA system 1100 (where such execution represents (at least in part) the EDA tool) to be usable for performing a portion or all of the noted processes and/or methods. In one or more embodiments, the storage medium 1160 also stores information which facilitates performing a portion or all of the noted processes and/or methods. In one or more embodiments, storage medium 1160 stores library 1162 of standard cells including such standard cells as disclosed herein, for example, cells including transistors 411-412, 421-424 and 431-434 discussed above with respect to FIGS. 4A-4C.

The EDA system 1100 includes the I/O interface 1110. The I/O interface 1110 is coupled to external circuitry. In one or more embodiments, the I/O interface 1110 includes a keyboard, keypad, mouse, trackball, trackpad, touchscreen, and/or cursor direction keys for communicating information and commands to the processor 1120.

EDA system 1100 also includes the network interface 1130 coupled to processor 1120. The network interface 1130 allows the EDA system 1100 to communicate with the network 1140, to which one or more other computer systems are connected. The network interface 1130 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1100.

The EDA system 1100 also includes the fabrication tool 1170 coupled to the processor 1120. The fabrication tool 1170 is configured to fabricate integrated circuits, e.g., the integrated circuit of delay circuits 10, 20, 30, 40, 50, according to the design files processed by the processor 1120.

The EDA system 1100 is configured to receive information through I/O interface 1110. The information received through the I/O interface 1110 includes one or more of instructions, data, design rules, libraries of standard cells, and/or other parameters for processing by the processor 1120. The information is transferred to the processor 1120 via the bus 1150. The EDA system 1100 is configured to receive information related to a user interface (UI) through the I/O interface 1110. The information is stored in computer-readable storage medium 1160 as user interface (UI) 1163.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 12:
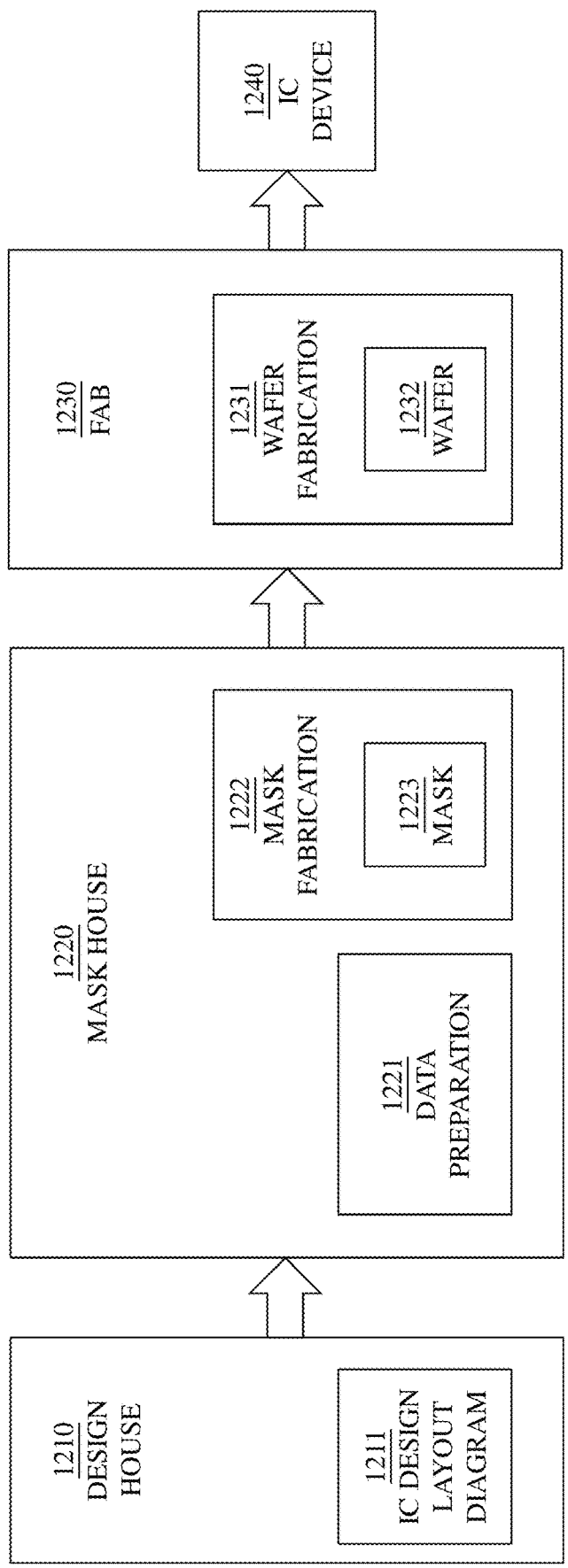
FIG. 12 is a block diagram of IC manufacturing system, and an IC manufacturing flow associated therewith, in accordance with some embodiments.

FIG. 12 is a block diagram of IC manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the IC manufacturing system 1200.

In FIG. 12, the IC manufacturing system 1200 includes entities, such as a design house 1210, a mask house 1220, and an IC manufacturer/fabricator ("fab") 1230, that interact with one another in the design, development, and manufacturing cycles and/or services related to manufacturing an IC device 1240. The entities in IC manufacturing system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1210, mask house 1220, and IC fab 1230 is owned by a single larger company. In some embodiments, two or more of design house 1210, mask house 1220, and IC fab 1230 coexist in a common facility and use common resources.

Design house (or design team) 1210 generates an IC design layout diagram 1211. The IC design layout diagram 1211 includes various geometrical patterns, for example, an IC layout design depicted in FIGS. 6B and 9B. The geometrical patterns correspond to patterns of metal, oxide, or semiconductor layers that make up the various components of IC device 1240 to be fabricated. The various layers combine to form various IC features. For example, a portion of IC design layout diagram 1211 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1210 implements a proper design procedure to form IC design layout diagram 1211. The design procedure includes one or more of logic design, physical design or place and route. The IC design layout diagram 1211 is presented in one or more data files having information of the geometrical patterns. For example, the IC design layout diagram 1211 can be expressed in a GDSII file format or DFII file format.

The mask house 1220 includes data preparation 1221 and mask fabrication 1222. The mask house 1220 uses the IC design layout diagram 1211 to manufacture one or more masks 1223 to be used for fabricating the various layers of IC device 1240 according to the IC design layout diagram 1211. The mask house 1220 performs mask data preparation 1221, where IC design layout diagram 1211 is translated into a representative data file ("RDF"). The mask data preparation 1221 provides the RDF to the mask fabrication 1222. The mask fabrication 1222 includes a mask writer. A mask writer converts the RDF to an image on a substrate, such as a mask (reticle) 1223 or a semiconductor wafer 1232. The IC design layout diagram 1211 is manipulated by the mask data preparation 1221 to comply with particular characteristics of the mask writer and/or requirements of the IC fab 1230. In FIG. 12, the data preparation 1221 and the mask fabrication 1222 are illustrated as separate elements. In some embodiments, the data preparation 1221 and the mask fabrication 1222 can be collectively referred to as mask data preparation.

In some embodiments, the data preparation 1221 includes optical proximity correction (OPC) which uses lithography enhancement techniques to compensate for image errors, such as those that can arise from diffraction, interference, other process effects and the like. The OPC adjusts the IC design layout diagram 1211. In some embodiments, the data preparation 1221 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats the OPC as an inverse imaging problem.

In some embodiments, data preparation 1221 includes a mask rule checker (MRC) that checks the IC design layout diagram 1211 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1211 to compensate for limitations during the mask fabrication 1222, which may undo part of the modifications performed by OPC in order to meet mask creation rules.

In some embodiments, data preparation 1221 includes lithography process checking (LPC) that simulates processing that will be implemented by the IC fab 1230 to fabricate the IC device 1240. The LPC simulates this processing based on IC design layout diagram 1211 to create a simulated manufactured device, such as IC device 1240. The processing parameters in LPC simulation can include parameters associated with various processes of the IC manufacturing cycle, parameters associated with tools used for manufacturing the IC, and/or other aspects of the manufacturing process. The LPC takes into account various factors, such as aerial image contrast, depth of focus ("DOF"), mask error enhancement factor ("MEEF"), other suitable factors, and the like or combinations thereof. In some embodiments, after a simulated manufactured device has been created by the LPC, if the simulated device is not close enough in shape to satisfy design rules, the OPC and/or the MRC are be repeated to further refine the IC design layout diagram 1211.

It should be understood that the above description of data preparation 1221 has been simplified for the purposes of clarity. In some embodiments, data preparation 1221 includes additional features such as a logic operation (LOP) to modify the IC design layout diagram 1211 according to manufacturing rules. Additionally, the processes applied to IC design layout diagram 1211 during data preparation 1221 may be executed in a variety of different orders.

After the data preparation 1221 and during mask fabrication 1222, a mask 1223 or a group of masks 1223 are fabricated based on the modified IC design layout diagram 1211. In some embodiments, the mask fabrication 1222 includes performing one or more lithographic exposures based on the IC design layout diagram 1211. In some embodiments, an electron-beam (e-beam) or a mechanism of multiple e-beams is used to form a pattern on a mask (photomask or reticle) 1223 based on the modified IC design layout diagram 1211. The mask 1223 can be formed in various technologies. In some embodiments, the mask 1223 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of the mask 1223 includes a transparent substrate (for example, fused quartz) and an opaque material (for example, chromium) coated in the opaque regions of the binary mask. In another example, the mask 1223 is formed using a phase shift technology. In a phase shift mask (PSM) version of the mask 1223, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 1222 is used in a variety of processes. For example, such a mask(s) is used in an ion implantation process to form various doped regions in the semiconductor wafer 1232, in an etching process to form various etching regions in the semiconductor wafer 1232, and/or in other suitable processes.

The IC fab 1230 includes wafer fabrication 1231. The IC fab 1230 is an IC fabrication business that includes one or more manufacturing facilities for the fabrication of a variety of different IC products. In some embodiments, the IC Fab 1230 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

The IC fab 1230 uses mask(s) 1223 fabricated by mask house 1220 to fabricate the IC device 1240. Thus, the IC fab 1230 at least indirectly uses IC design layout diagram 1211 to fabricate the IC device 1240. In some embodiments, the semiconductor wafer 1233 is fabricated by the IC fab 1230 using the mask(s) 1223 to form IC device 1240. In some embodiments, the IC fabrication includes performing one or more lithographic exposures based at least indirectly on the IC design layout diagram 1211. Semiconductor wafer 1233 includes a silicon substrate or other proper substrate having material layers formed thereon. The semiconductor wafer 1233 further includes one or more of various doped regions, dielectric features, multilevel interconnects, and the like (formed at subsequent manufacturing steps).

As described above, a delay circuit and a method for operating the delay circuit are provided. In addition, layout of the semiconductor device of the delay circuit is also provided. With the provided configurations of connections between the input signal, the metal lines and the delay elements, the delay circuit of the present disclosure generates a delay time with high area efficiency.

In some embodiments, a circuit is provided. The circuit comprises a first power switch, a second power switch and delay elements. The first power switch adjusts a first voltage on a first metal line according to an input signal. The second power switch adjusts a second voltage on a second metal line according to the first voltage. The delay elements are coupled between the first metal line and the second metal line, and delay, in response to the adjusted first voltage and the adjusted second voltage, the input signal to generate an output signal.

In some embodiments, a circuit is provided. The circuit comprises: a first power switch, a second power switch, delay elements, a first delay element and a second delay element. The first power switch is coupled to a first metal line and provides a first voltage on the first metal line in response to an input signal. The second power switch is coupled between the first metal line and a second metal line and provides a second voltage on the second metal line in response to the first voltage. The delay elements are coupled in series. The first delay element is coupled to the first voltage and a third voltage. The first delay element comprises: a first input terminal coupled to the input signal; and an output terminal coupled to the plurality of delay elements. The second delay element powered by the second voltage and a fourth voltage. The second delay element comprises: a first input terminal coupled to the plurality of delay elements; and an output terminal configured to generate an delayed signal of the input signal.

In some embodiments, a method is provided. The method comprises: pulling down, by a first power switch, a first voltage on a first metal line in response to an input signal; pulling up, by a second power switch, a second voltage on a second metal line in response to the first voltage being pulled down; powering up a plurality of delay elements by the first and second voltages; and pulling up an output signal through the plurality of delay elements in response to the second voltage being pulled up after a first delay time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first power switch configured to adjust a first voltage on a first metal line according to an input signal;
a second power switch configured to adjust a second voltage on a second metal line according to the first voltage; and
a plurality of delay elements coupled between the first metal line and the second metal line, and configured to delay, in response to the adjusted first voltage and the adjusted second voltage, the input signal to generate an output signal.

2. The circuit of claim 1, wherein the plurality of delay elements are logic gates coupled in series.

3. The circuit of claim 1, wherein the adjusted first voltage and the adjusted second voltage are supply voltages of the plurality of delay elements,
wherein the adjusted first voltage is smaller than the adjusted second voltage.

4. The circuit of claim 1, wherein the first power switch is a first inverter, wherein an input terminal of the first inverter is coupled to the input signal and an output terminal of the first inverter is coupled to the first metal line,
wherein the second power switch is a second inverter, wherein an input terminal of the second inverter is coupled to the first metal line and an output terminal of the first inverter is coupled to the second metal line.

5. The circuit of claim 4, wherein an input terminal of a first delay element of the plurality of delay elements is coupled to the second metal line.

6. The circuit of claim 1, wherein the plurality of delay elements comprise a plurality of NAND gates and a plurality of NOR gates that are coupled in series alternatively.

7. The circuit of claim 6, wherein the plurality of NOR gates are configured to receive a third voltage as a VSS source and are coupled to the second metal line to receive the second voltage as a VDD source.

8. The circuit of claim 7, wherein the plurality of NAND gates are configured to receive a fourth voltage as a VDD source and are coupled to the first metal line to receive the first voltage as a VSS source, wherein the fourth voltage is higher than the third voltage.

9. The circuit of claim 6, further comprising:
a first NAND gate, wherein a first input terminal of the first NAND gate is coupled to the second metal line and a second input terminal of the first NAND gate is coupled to the input signal,
wherein a first input terminal of a first NOR gate of the plurality of NOR gates is coupled to an output terminal of the first NAND gate and a second input terminal of the first NOR gate is coupled to the first metal line.

10. The circuit of claim 9, wherein a first input terminal of a second NAND gate of the plurality of NAND gates is coupled to the second metal line and a second input terminal of the second NAND gate is coupled to an output terminal of the first NOR gate.

11. The circuit of claim 6, further comprising:
a first NOR gate powered by the first voltage and a ground voltage, wherein a first input terminal of the first NOR gate is coupled to the second metal line, a second input terminal of the first NAND gate is coupled to the input signal and an output terminal of the first NOR gate is coupled to the plurality of delay elements to delay the input signal.

12. A circuit comprising:
a first power switch coupled to a first metal line and configured to provide a first voltage on the first metal line in response to an input signal;
a second power switch that is coupled between the first metal line and a second metal line and is configured to provide a second voltage on the second metal line in response to the first voltage;
a plurality of delay elements coupled in series;
a first delay element coupled to the first voltage and a third voltage, wherein the first delay element comprises:
a first input terminal coupled to the input signal; and an output terminal coupled to the plurality of delay elements; and a second delay element powered by the second voltage and a fourth voltage, wherein the second delay element comprises:
- a first input terminal coupled to the plurality of delay elements; and
- an output terminal configured to generate an delayed signal of the input signal.

13. The circuit of claim 12, wherein the first delay element is a NOR gate and further comprises a second input terminal coupled to the second metal line, wherein the second delay element is a NAND gate and further comprises a second input terminal coupled to the first metal line.

14. The circuit of claim 13, wherein the plurality of delay element comprise:
- a third delay element that is a NAND gate, wherein a first input terminal of the third delay element is coupled to the first metal line and a second terminal of the third delay element is coupled to the output terminal of the first delay element; and
- a fourth delay element that is a NOR gate, wherein a first input terminal of the fourth delay element is coupled to the output terminal of the third delay element and a second input terminal of the fourth delay element is coupled to the second metal line.

15. The circuit of claim 14, wherein the first metal line is in a first semiconductor layer, wherein the first power switch comprises a first conductive segment in a second semiconductor layer under the first semiconductor layer and the first power switch is coupled to the first metal line through the first conductive segment, wherein the first delay element comprises a second conductive segment in the second semiconductor layer and the first delay element is coupled to the first metal line through the second conductive segment, wherein the third delay element comprises the second conductive segment and is coupled to the first metal line through the second conductive segment.

16. The circuit of claim 15, wherein the first conductive segment and the second conductive segment are coupled to a first active region, wherein the first active region and the first metal line extend along a first direction.

17. The circuit of claim 16, wherein the first conductive segment corresponds to the output terminal of the first power switch, and the second conductive segment corresponds to power terminals of the first and third delay element.

18. The circuit of claim 16, wherein the second metal line is in the first semiconductor layer, wherein the second power switch comprises a third conductive segment in the second semiconductor and the second power switch is coupled to the second metal line through the third conductive segment, wherein the second delay element comprises a fourth conductive segment in the second semiconductor layer and the second delay element is coupled to the second metal line through the fourth conductive segment, wherein the fourth delay element comprises the fourth conductive segment and is coupled to the second metal line through the fourth conductive segment, wherein the third conductive segment and the fourth conductive segment are coupled to a second active region separated from the first active region along a second direction different from the first direction.

19. A method, comprising:

pulling down, by a first power switch, a first voltage on a first metal line in response to an input signal;

pulling up, by a second power switch, a second voltage on a second metal line in response to the first voltage being pulled down;

powering up a plurality of delay elements by the first and second voltages; and pulling up an output signal through the plurality of delay elements in response to the second voltage being pulled up after a first delay time.

20. The method of claim 19, further comprising:

transmitting the input signal to the plurality of delay elements; and pulling down the output signal through the plurality of delay elements in response to the input signal pulled down after a second delay time.

* * * * *